US011294293B2

(12) United States Patent
Hsieh et al.

(10) Patent No.: US 11,294,293 B2
(45) Date of Patent: Apr. 5, 2022

(54) OVERLAY MARKS FOR REDUCING EFFECT OF BOTTOM LAYER ASYMMETRY

(71) Applicant: Taiwan Semiconductor Manufacturing Co., Ltd., Hsin-Chu (TW)

(72) Inventors: Hung-Chih Hsieh, Miaoli County (TW); Kai-Hsiung Chen, New Taipei (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 264 days.

(21) Appl. No.: 16/295,510

(22) Filed: Mar. 7, 2019

(65) Prior Publication Data

US 2020/0089132 A1    Mar. 19, 2020

Related U.S. Application Data

(60) Provisional application No. 62/733,125, filed on Sep. 19, 2018.

(51) Int. Cl.
*H01L 23/544* (2006.01)
*G03F 9/00* (2006.01)
*G03F 7/20* (2006.01)

(52) U.S. Cl.
CPC ........ *G03F 9/7076* (2013.01); *G03F 7/70633* (2013.01); *G03F 9/7084* (2013.01); *G03F 9/7088* (2013.01); *H01L 23/544* (2013.01)

(58) Field of Classification Search
CPC ......... H01L 23/544; H01L 2223/54426; H01L 21/0274; G03F 7/70633; G03F 9/7076;
(Continued)

(56) References Cited

U.S. PATENT DOCUMENTS 6,255,189 B1 *   7/2001   Muller ..................... G03F 9/70
                                                        438/401
8,628,897 B1     1/2014   Lu et al.
(Continued)

OTHER PUBLICATIONS

Lee, Yu-Ching et al., "Multi-Function Overlay Marks for Reducing Noise and Extracting Focus and Critical Dimension Information", U.S. Appl. No. 16/026,309, filed Jul. 3, 2018, 87 pages.

*Primary Examiner* — Bilkis Jahan
*Assistant Examiner* — Victor V Barzykin
(74) *Attorney, Agent, or Firm* — Haynes and Boone, LLP

(57) ABSTRACT

Methods of fabricating and using an overlay mark are provided. In some embodiments, the overlay mark includes an upper layer and a lower layer disposed below the upper layer. The lower layer includes a first plurality of compound gratings extending in a first direction and disposed in a first region of the overlay mark, each of the first plurality of compound gratings including one first element and at least two second elements disposed on one side of the first element, and a second plurality of compound gratings extending the first direction and disposed in a second region of the overlay mark, each of the second plurality of compound gratings including one third element and at least two fourth elements on one side of the third element. The first plurality of compound gratings is a mirror image of the second plurality of compound gratings.

20 Claims, 12 Drawing Sheets

(58) Field of Classification Search
CPC .. G03F 9/7088; G03F 9/7084; G03F 7/70033; G03F 1/24; G03F 1/22; G03F 1/38
See application file for complete search history.

(56) References Cited

U.S. PATENT DOCUMENTS

| | | | |
|---|---|---|---|
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,722,286 B2 | 5/2014 | Yu et al. | |
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 2003/0002043 A1* | 1/2003 | Abdulhalim | G01B 11/26 356/400 |
| 2004/0246482 A1* | 12/2004 | Sezginer | G01N 21/4788 356/401 |
| 2005/0122516 A1* | 6/2005 | Sezginer | G03F 7/70633 356/401 |
| 2006/0065625 A1* | 3/2006 | Abdulhalim | H01L 22/12 216/59 |
| 2006/0117293 A1* | 6/2006 | Smith | H01L 22/12 716/50 |
| 2006/0250597 A1* | 11/2006 | Nakajima | G03F 9/7049 355/55 |
| 2009/0116035 A1* | 5/2009 | Shyu | G03F 7/70633 356/508 |
| 2013/0202992 A1 | 8/2013 | Chen et al. | |
| 2013/0342831 A1* | 12/2013 | Levinski | G01N 21/47 356/237.1 |
| 2014/0002822 A1* | 1/2014 | Chen | H01L 29/78 356/400 |
| 2015/0286146 A1 | 10/2015 | Chang et al. | |
| 2015/0309405 A1 | 10/2015 | Shih et al. | |
| 2015/0311075 A1 | 10/2015 | Huang et al. | |
| 2015/0346605 A1* | 12/2015 | Den Boef | G03F 9/708 438/401 |
| 2016/0025650 A1* | 1/2016 | Lee | G01N 21/95607 348/87 |
| 2016/0043037 A1* | 2/2016 | Nakagawa | G03F 7/70633 257/797 |
| 2016/0179017 A1* | 6/2016 | Yohanan | G03F 7/70633 356/401 |
| 2016/0274456 A1* | 9/2016 | Chen | G03F 7/70558 |
| 2016/0300767 A1* | 10/2016 | Ko | G03F 7/70633 |
| 2017/0184977 A1* | 6/2017 | Jak | G02B 5/1823 |
| 2017/0221832 A1* | 8/2017 | Park | H01L 23/544 |
| 2018/0129139 A1* | 5/2018 | Jiang | G03F 7/70508 |
| 2018/0203367 A1* | 7/2018 | Jak | G01N 21/9505 |

* cited by examiner

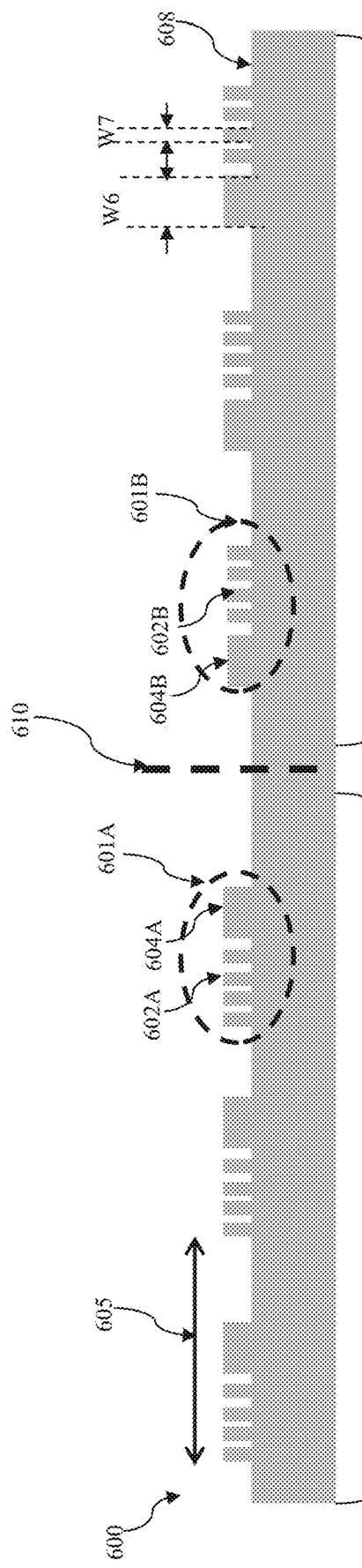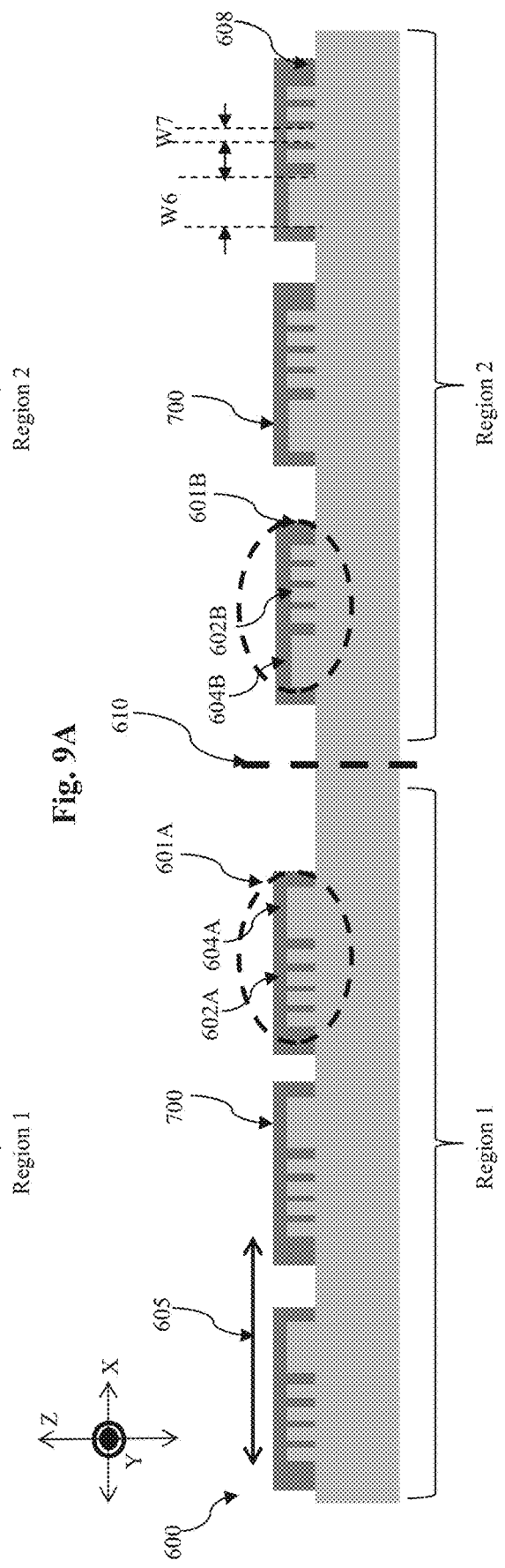

1000

1002: Patterning an overlay mark on a wafer. The overlay mark includes an upper layer, and a lower layer disposed below the upper layer. The lower layer can include a first plurality of compound gratings and a second plurality of compound gratings. The first plurality of compound gratings extends in a first direction and is disposed in a first region of the overlay mark. Each of the first plurality of compound gratings can include one first element and at least two second elements disposed on one side of the first element. The second plurality of compound gratings extends in the first direction and is disposed in a second region of the overlay mark. Each of the second plurality of compound gratings can include one third element and at least two fourth elements disposed on one side of the third element. The first plurality of compound gratings is a mirror image of the second plurality of compound gratings.

1004: Performing one or more semiconductor manufacturing processes using the overlay mark

Fig. 10

OVERLAY MARKS FOR REDUCING EFFECT OF BOTTOM LAYER ASYMMETRY

PRIORITY DATA

The present application claims the benefit of U.S. Provisional Application No. 62/733,125, entitled "Overlay Marks for Reducing Effect of Bottom Layer Asymmetry," filed Sep. 19, 2018, herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Overlay marks have been used to measure the overlay or alignment between various layers of an IC. However, conventional overlay marks still have shortcomings. For example, the measurement accuracy of a conventional overlay mark with an upper layer and a lower layer (sometimes referred to as a "bottom layer") may be affected by asymmetry of the gratings in the bottom layer. The asymmetry in the bottom gratings can induce additional diffraction orders, resulting in reduced overlay accuracy. Therefore, while existing overlay marks and have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 9A illustrates a fragmentary cross-sectional view of the mandrel features in FIG. 8, according to embodiments of the present disclosure.

FIG. 9B illustrates a fragmentary cross-sectional view of spacer material deposited over the mandrel features in FIG. 9A, according to embodiments of the present disclosure.

FIGS. 10 and 11 are flowcharts illustrating methods of semiconductor fabrication associated with the overlay marks in accordance with some embodiments of the present disclosure.

DETAILED DESCRIPTION

Figure 1:
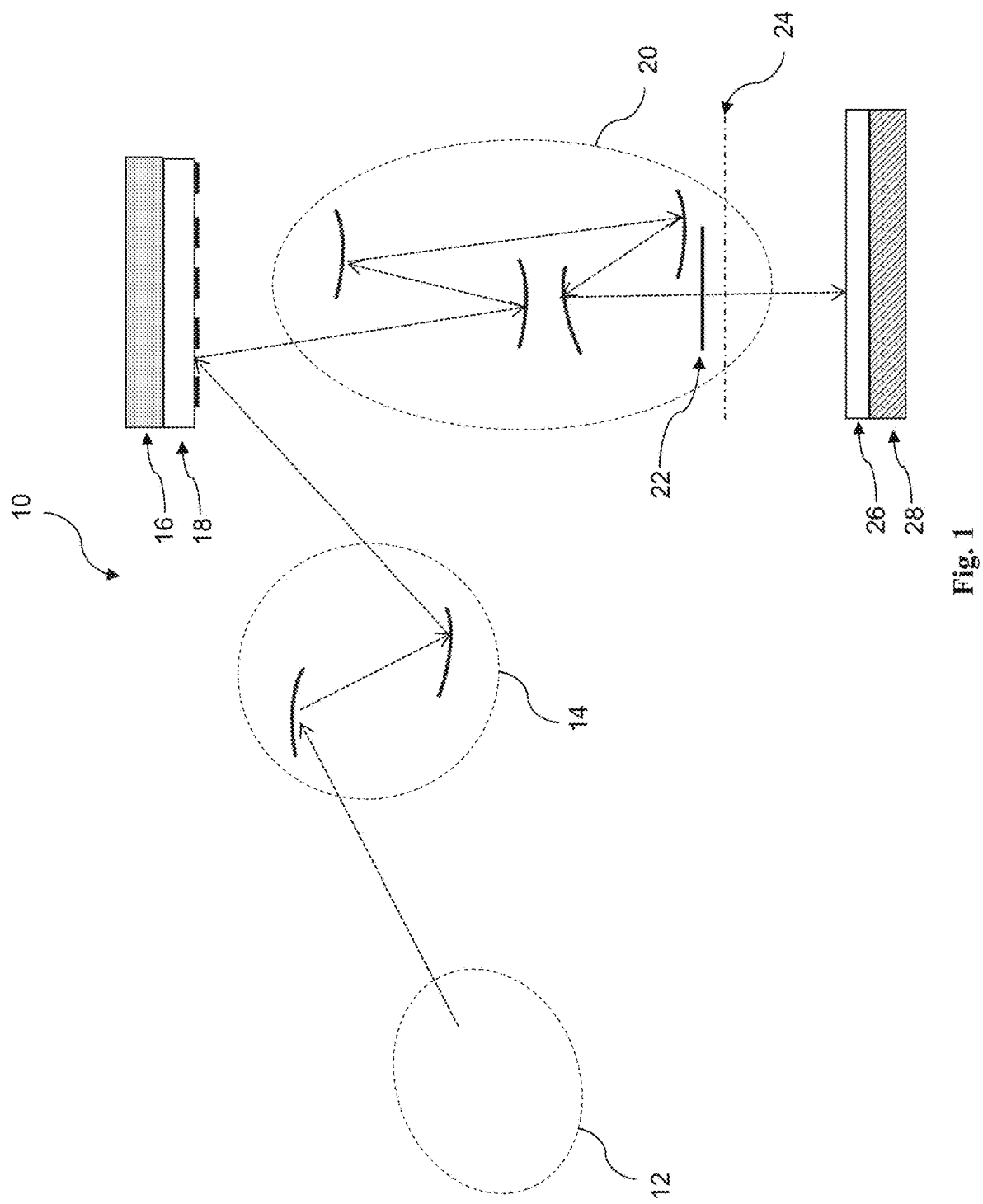
FIG. 1 is a schematic view of a lithography system constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To ensure accurate alignment (also referred to as overlay) between the various layers in a semiconductor device during a semiconductor fabrication process, overlay marks (or alignment marks) are used to measure the alignment between the layers. However, conventional overlay marks may have shortcomings. For example, lower layers of conventional overlay marks can have asymmetric gratings, resulting in overlay inaccuracy.

To overcome the problems discussed above, the present disclosure provides embodiments of overlay marks that can reduce overlay inaccuracy resulting from bottom grating asymmetry. The various aspects of the present disclosure will be discussed below in greater detail with reference to FIGS. 1-9D. First, a EUV lithography system will be discussed below with reference to FIGS. 1-3 as an example lithography context in which the overlay mark of the present disclosure may be used, although it is understood that the overlay mark discussed herein may be used for other types of non-EUV lithography contexts too. Next, the details of the overlay mark according to embodiments of the present disclosure are discussed with reference to FIGS. 4A-9D.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence a being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence a of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. In some embodiments, the LTEM includes 5%-20% by weight $TiO_2$ and has a thermal coefficient of expansion lower than about $1.0 \times 10-6/°$ C. For example, in some embodiments, the $TiO_2$ doped $SiO_2$ material of the LTEM has a coefficient thermal expansion such that it varies by less than 60 parts-per-billion for every 1 degree Celsius of temperature change. Of course, other suitable materials having thermal coefficient of expansion that is equal to or less than $TiO_2$ doped $SiO_2$ may also be used.

The mask 18 also includes a reflective multilayer (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a target 26 secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor substrate, such as a silicon substrate or other type of substrate. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor substrate. The patterns can be transferred over and over onto multiple substrates through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
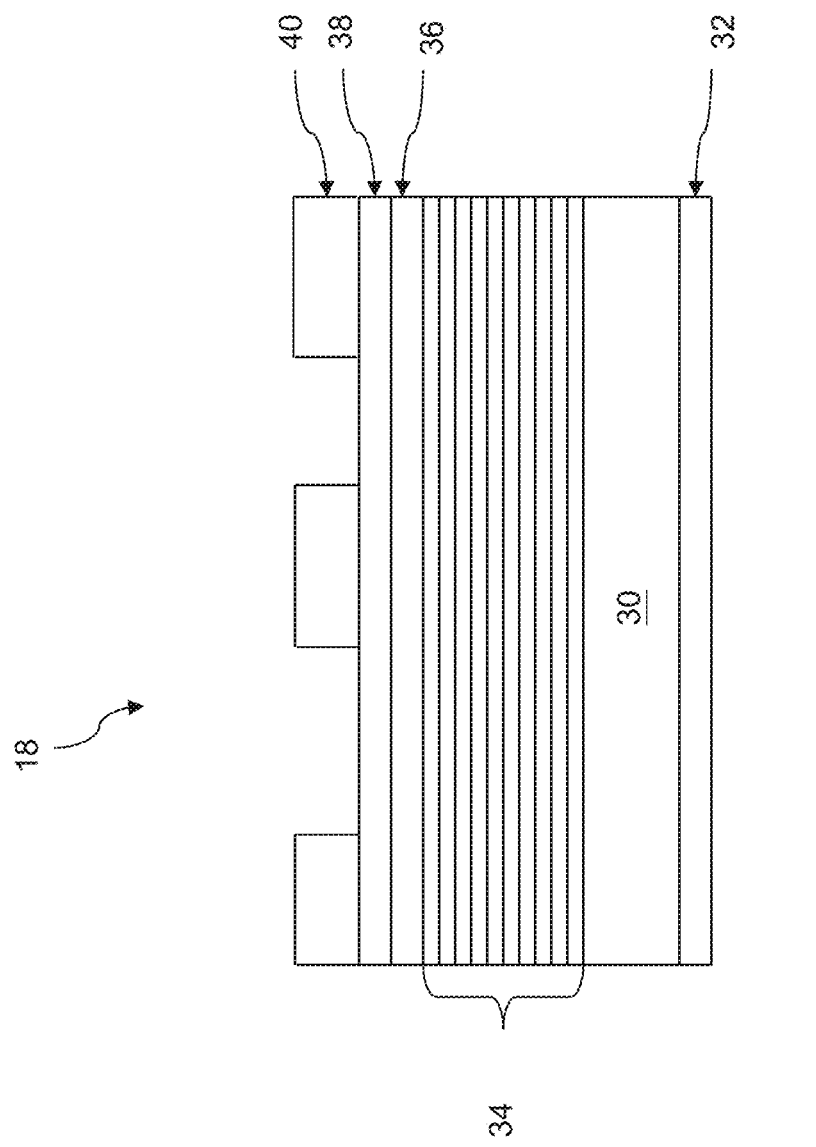
FIG. 2 is a sectional view of a EUV mask constructed in accordance with some embodiments of the present disclosure.

One example of the mask 18 is shown in FIG. 2. The mask 18 in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN). In other embodiments, other suitable compositions are possible, such as a tantalum-containing material.

The EUV mask 18 includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 18 also includes a capping layer 36 disposed over the ML structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

The EUV lithography system discussed above in FIGS. 1-2 is merely an example lithography system for which overlay marks can be used. However, the overlay marks of the present disclosure may be used for other types of lithography systems having different light sources. The overlay marks of the present disclosure will now be discussed below in more detail.

Figure 3:
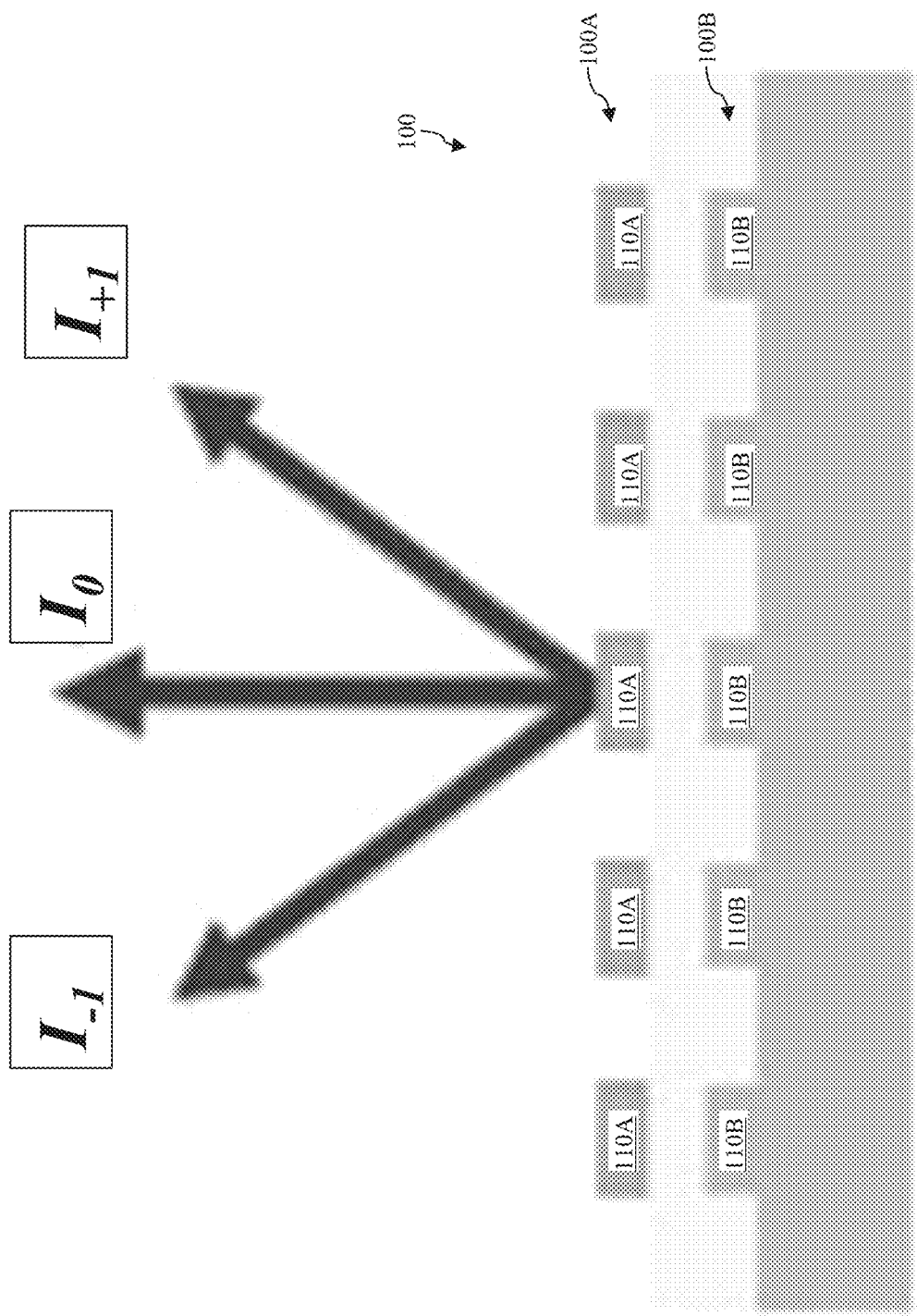
FIG. 3 illustrates a simplified fragmentary cross-sectional view of an overlay mark 100 in accordance with some embodiments of the present disclosure.
Figure 4:
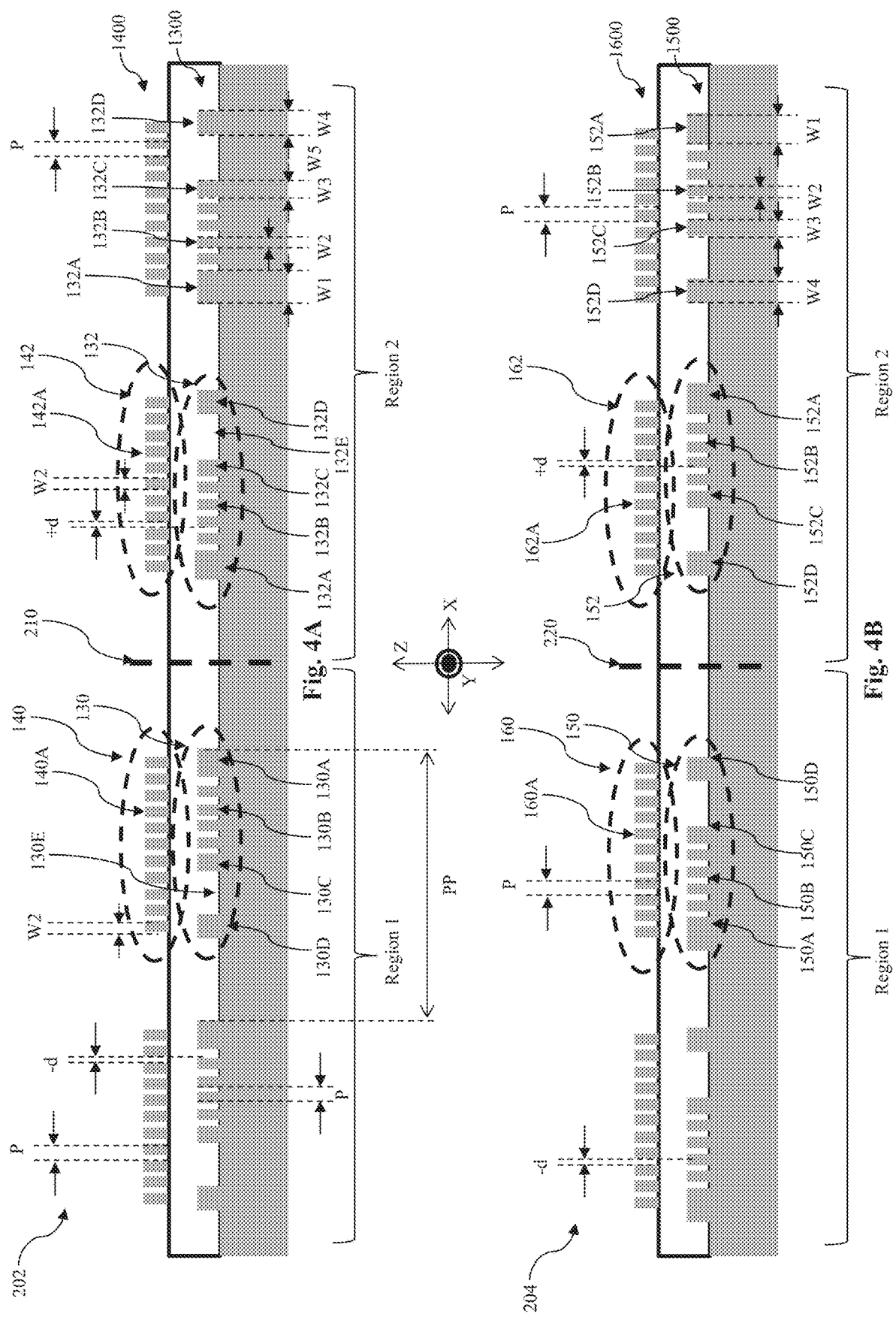
FIG. 4A illustrates fragmentary cross-sectional view of an upper layer 1400 and a lower layer 1300 in accordance with some embodiments of the present disclosure.
FIG. 4B illustrates fragmentary cross-sectional view of an upper layer 1600 and a lower layer 1500 in accordance with some embodiments of the present disclosure.

FIG. 3 illustrates a simplified fragmentary cross-sectional side view of an overlay mark 100. The overlay mark 100 includes an upper layer 100A and a lower layer 100B. In some embodiments, the upper layer 100A includes a patterned photoresist layer, and the lower layer 100B includes a patterned spacer layer on a substrate. In other embodiments, the upper layer 100A and the lower layer 100B may include different patterned layers on a substrate.

The upper layer 100A and the lower layer 100B each include a plurality of patterned components, also referred to as gratings. For example, the upper layer 100A includes a plurality of gratings 110A, and the lower layer 100B includes a plurality of gratings 110B. The gratings 110A and 110B are elongated features that extend in a certain direction, for example in a direction orthogonal to the cross-section in which the cross-sectional view of FIG. 3 is taken. In some embodiments, the gratings 110A are periodically distributed, and/or the gratings 110B are periodically distributed. In other words, the gratings 110A are separated from one another by a constant spacing, and the gratings 110B are separated from one another by a constant spacing.

An overlay between the upper layer 100A and the lower layer 100B may be measured by light diffraction. For example, in response to incident light projected onto the overlay mark 100, different orders of diffracted light may be produced as a result. In FIG. 3, a 0th order diffracted light is shown as $I_0$, a +1 order diffracted light is shown as $I_{+1}$, and a −1 order diffracted light is shown as $I_{-1}$. The intensities of the various diffracted orders of light may be measured by an optical measurement tool. In some embodiments, the optical measurement tool includes a scatterometry machine. In some other embodiments, the optical measurement tool includes a diffractometry machine. It is understood that the optical measurement tool may also be configured to generate the incident light in some embodiments. Based on the measured $I_{+1}$ and $I_{-1}$ data, asymmetry information (As) associated with the overlay mark 100 can be defined as =$I_{+1}$−$I_{-1}$. The asymmetry information is used to determine overlay, as discussed in more detail below.

Referring now to FIG. 4A, shown therein is fragmentary cross-sectional view of an upper layer 1400 and a lower layer 1300 of an overlay mark 202 according to some embodiments of the present disclosure. In some embodiments, the overlay mark 202 includes region 1 and region 2. In some implementations, the upper layer 1400 and the lower layer 1300 may be two different layers of the overlay mark 202 on a substrate, such as a photomask. The lower layer 1300 includes a plurality of compound gratings 130 in region 1 and a plurality of compound gratings 132 in region 2. The plurality of compound gratings 130 extend along the y direction (into and out of the cross-sectional plane). In some implementations, the plurality of compound gratings 130 in the lower layer 1300 includes one elongated element 130A having a width W1, a plurality of elongated elements 130B each having a width W2, one elongated element 130C having a width W3, and one elongated element 130D with a width W4, where the widths are measured in an X-direction perpendicular to the Y-direction. In the implementations represented by FIG. 4A, the width W2 is smaller than each of the width W1, the width W3 and the width W4. The width W1, the width W3 and the Width W4 can be different from one another due to intentional loading effect differential introduced by different widths of the mandrels used to form the elongated elements. In one non-limiting example, the width W4 is greater than the width W3. In some embodiments, the plurality of compound gratings 130 in region 1 of the lower layer 1300 includes a gap 130E between the elongated element 130C and the elongated element 130D. In some instances, the gap 130E includes a width W5, and W5 is represents a width of a removed mandrel that is used to form the elongated element 130C and the elongated element 130D. In some embodiments, the plurality of elongated elements 130B is periodically disposed at a pitch P, and each of the plurality of elongated elements 130B is separated from one another by a constant spacing. The constant spacing is smaller than the width W5. In some instances, the plurality of elongated elements 130B includes 2 to 15 elongated elements, for example 4 to 12 elongated elements. While the embodiments shown in FIG. 4A include pluralities of compound gratings 130 and 132 extending along the Y direction, the pluralities of compound gratings may be arranged to extend along the X direction. It is also understood that the region 1 may have multiple groups of the plurality of compound gratings 130. In some embodiments, these groups of the plurality of compound gratings 130 are periodically repeated.

The plurality of compound gratings 132 in region 2 is a mirror image of the plurality of compound gratings 130 in region 1 with respect to the borderline 210 between region 1 and region 2. The plurality of compound gratings 132 in the lower layer 1300 includes one elongated element 132A having the width W1, a plurality of elongated elements 132B each having the width W1, one elongated element 132C having the width W3, and one elongated element 132D with the width W4. Similarly, in some instances, the width W1 is greater than the width W4, the width W4 is greater than the width W3, and the width W3 is greater than the width W2. In some embodiments, the plurality of elongated elements 132B is periodically disposed at the pitch P, and each of the plurality of elongated elements 132B is separated from one another by the constant spacing. In some embodiments, the plurality of compound gratings 132 in region 1 of the lower layer 1300 includes a gap 132E between the elongated element 132C and the elongated element 132D. In some instances, the gap 132E includes the width W5, and the width W5 is greater than W1. The width W5 is greater than the constant spacing. In some embodiments, the plurality of elongated elements 132B includes 2 to 15 elongated elements, for example 4 to 12 elongated elements. It is also understood that the region 2 may have multiple groups of the plurality of compound gratings 132. In some embodiments, these groups of the plurality of compound gratings 132 are periodically repeated.

In the embodiments represented by FIG. 4A, the upper layer 1400 includes a plurality of gratings 140 in region 1 and a plurality of gratings 142 in region 2. Both the plurality of gratings 140 and the plurality of gratings 142 extend along the Y direction (into and out of the cross-sectional plane) as well. In some implementations, the plurality of gratings 140 in region 1 includes elongated elements 140A disposed at the pitch P, and the plurality of gratings 142 in region 2 includes elongated elements 142A disposed at the same pitch P. The plurality of gratings 140 and the plurality of gratings 142 are identical and equally pitched. Each of the gratings in the plurality of gratings 140 and in the plurality of gratings 142 has the width W2. In some embodiments as shown in FIG. 4A, the plurality of gratings 140 is disposed above and over the plurality of compound gratings 130, and the plurality of gratings 142 is disposed above and over the plurality of compound gratings 132.

A known bias may be introduced between the upper layer 1400 and the lower layer 1300. For example, although the plurality of gratings 140 in region 1 of the upper layer 1400 shares the same pitch P and the same width W2 with the plurality of elongated elements 130B in the lower layer 1300, the plurality of gratings 140 is shifted by a distance d with respect to the plurality of elongated elements 130B along the −X direction (e.g., shifted to the "left" as shown in FIG. 4A). This shift in region 1 can be referred to as bias −d. Similarly, the plurality of gratings 142 in region 2 of the upper layer 1400 is shifted by a distance d with respect to the plurality of elongated elements 132B along the +X direction (e.g., shifted to the "right" as shown in FIG. 4A). This shift in region 2 can be referred to as bias +d. The bias −d in region 1 and the bias +d in region 2 may be intentionally configured or implemented as part of the design of the photomask.

As shown in the embodiments represented by FIG. 4A, out of the elongated elements of each of the plurality of compound gratings 130, the elongated element 130A with the width W1 is the closest to the borderline 210, and the elongated element 130D with the width W4 is the farthest away from the borderline 210. The plurality of compound gratings 132 in region 2, being the mirror image of the plurality of compound gratings 130 in region 1, includes a symmetric arrangement. The elongated element 132A with the width W1 is the closest to the borderline 210, and the elongated element 130D with the width W4 is the farthest away from the borderline 210. In some instances, the plurality of compound gratings 130 in region 1 can be referred to as "normal" gratings, and the plurality of compound gratings 132 in region 2 can be referred to as "inverse" gratings. Taking into consideration of the known bias introduced into the overlay mark 202, region 1 can be referred to "−d normal" and region 2 can be referred to as "+d normal."

Referring now to FIG. 4B, shown therein is another overlay mark 204. Similar to the embodiment represented by FIG. 4A, along the Z direction, the overlay mark 204 includes a lower layer 1500 and an upper layer 1600; and along the X direction, the overlay mark 204 includes a region 1 and a region 2. In some embodiments, the upper layer 1600 of the overlay mark 204 is substantially identical to the upper layer 1400 of the overlay mark 202. In region 1 of the lower layer 1500 is a plurality of compound gratings 150. In region 2 of the lower layer 1500 is a plurality of compound gratings 152. In some implementations, the plurality of compound gratings 152 in region 2 is substantially identical to the plurality of compound gratings 130 of the overlay mark 202, and the plurality of compound gratings 150 in region 1 is substantially identical to the plurality of compound gratings 132 of the overlay mark 202. That is, the plurality of compound gratings 152 in region 2 may be referred to as "normal" gratings and the plurality of compound gratings 150 in region 1 may be referred to as "inverse" gratings. In some implementations, each of the plurality of compound grating 150 includes one elongated element 150A, a plurality of elongated elements 150B, one elongated element 150C, and one elongated element 150D. In some embodiments, each of the plurality of compound gratings 152 includes one elongated element 152A, a plurality of elongated elements 152B, one elongated element 152C, and one elongated element 152D. Out of the elongated elements 150A-150D, the elongated element 150D is the closest to the borderline 220 between region 1 and region 2, and the elongated element 150A is the farthest away from the borderline 220. Out of the elongated elements 152A-152D, the elongated element 152D is the closest to the borderline 220 between region 1 and region 2, and elongated element 152A is the farthest away from the borderline 220.

In some embodiments, similar to the overlay mark 202, the plurality of gratings 160 and the plurality of gratings 162 in the upper layer 1600 of overlay mark 204 each include the pitch P. In a similar fashion, the pluralities of elongated elements 150B and 152B include the pitch P as well. The known bias d can be introduced between the upper layer 1600 and the lower layer 1500 in regions 1 and 2. In region 1, the plurality of gratings 160 is disposed above the plurality of compound gratings 150 and is shifted in the -X direction by a distance d. In region 2, The plurality of gratings 162 is above the plurality of compound gratings 152 and is shifted in the +X direction by a distance d. Viewing the exemplary overlay mark 202 in FIG. 4A and overlay mark 204 in FIG. 4B as a whole, region 1 of FIG. 4A can be referred to as "-d normal," region 2 of FIG. 4A can be referred to as "+d inverse," region 1 of FIG. 4B can be referred to as "-d inverse" and region 2 of FIG. 4B can be referred to as "+d normal." The plurality of elongated elements 150B includes 2 to 15 elongated elements, for example 4 to 12 elongated segments. The plurality of elongated elements 152B includes 2 to 15 elongated elements, for example 4 to 12 elongated elements.

Embodiments of the present disclosure provide advantages. Taking the overlay mark 202 in FIG. 4A as an example, the overlay information of region 1 can be described as $(OVL-OVL_{BGA})$. In the expression, the plurality of elongated elements 130B in region 1 of the lower layer 1300 and the compound gratings 140 in region 1 of the upper layer 1400 contribute to the overlay term OVL and provide alignment information. The elongated element 130A, the elongated element 130C and the elongated element 130D contribute to the additional bottom grating asymmetry (BGA) error term $-OVL_{BGA}$. The overlay information of region 2 can be described as $(OVL+OVL_{BGA})$. In the expression, the plurality of elongated elements 132B in region 2 of the lower layer 1300 and the compound gratings 142 in region 2 of the upper layer 1400 contribute to the overlay term OVL and provide alignment information. The elongated element 132A, the elongated element 132C and the elongated element 132D contribute to the additional BGA error term $+OVL_{BGA}$. Viewing the overlay mark 202 as a whole, the overlay information of the overlay mark 202 can be expressed as $(OVL-OVL_{BGA}+OVL+OVL_{BGA})/2$. Because the BGA error term from region 1 and the BGA error term from region 2 are substantially equal in magnitude and opposite in polarity, the BGA error terms can be canceled out, and the above expression $(OVL-OVL_{BGA}+OVL+OVL_{BGA})/2$ can be simplified as OVL. The designed-in BGA error terms for region 1 and region 2 reduce the asymmetry in the lower layer (or referred to as the bottom layer), improving the overlay accuracy.

In some instances, the design of the certain compound gratings in the lower layer (or bottom layer) can have varying densities therein. Taking the compound gratings 132 as an example, due to the presence of the gap 132E, the gratings on the left-hand side of the compound gratings 132 are denser than the right-hand side thereof. This design of compound gratings 132 includes a wider mandrel to form the gap and a plurality of narrower mandrels to form the denser side of the compound gratings 132. The difference in mandrel density can introduce different loading and create unevenness or imperfection in the compound gratings 132. The compound gratings 130 are a mirror image of the compound gratings 132. Because formation of the compound gratings 130 includes a mirror image of the mandrels used to form the compound gratings 132, the unevenness or imperfection in the compound grating 130 is likely a mirror image of the unevenness or imperfection in the compound grating 132. This mirror imaging allows the error terms in region 1 and region 2 to cancel each other out, yielding better alignment accuracy. In other words, although imperfections may be caused by the different densities of the compound gratings 132, these imperfections may be obviated by the fact that the compound gratings 130 are designed as a mirror image of the compound gratings 132.

Figure 5:
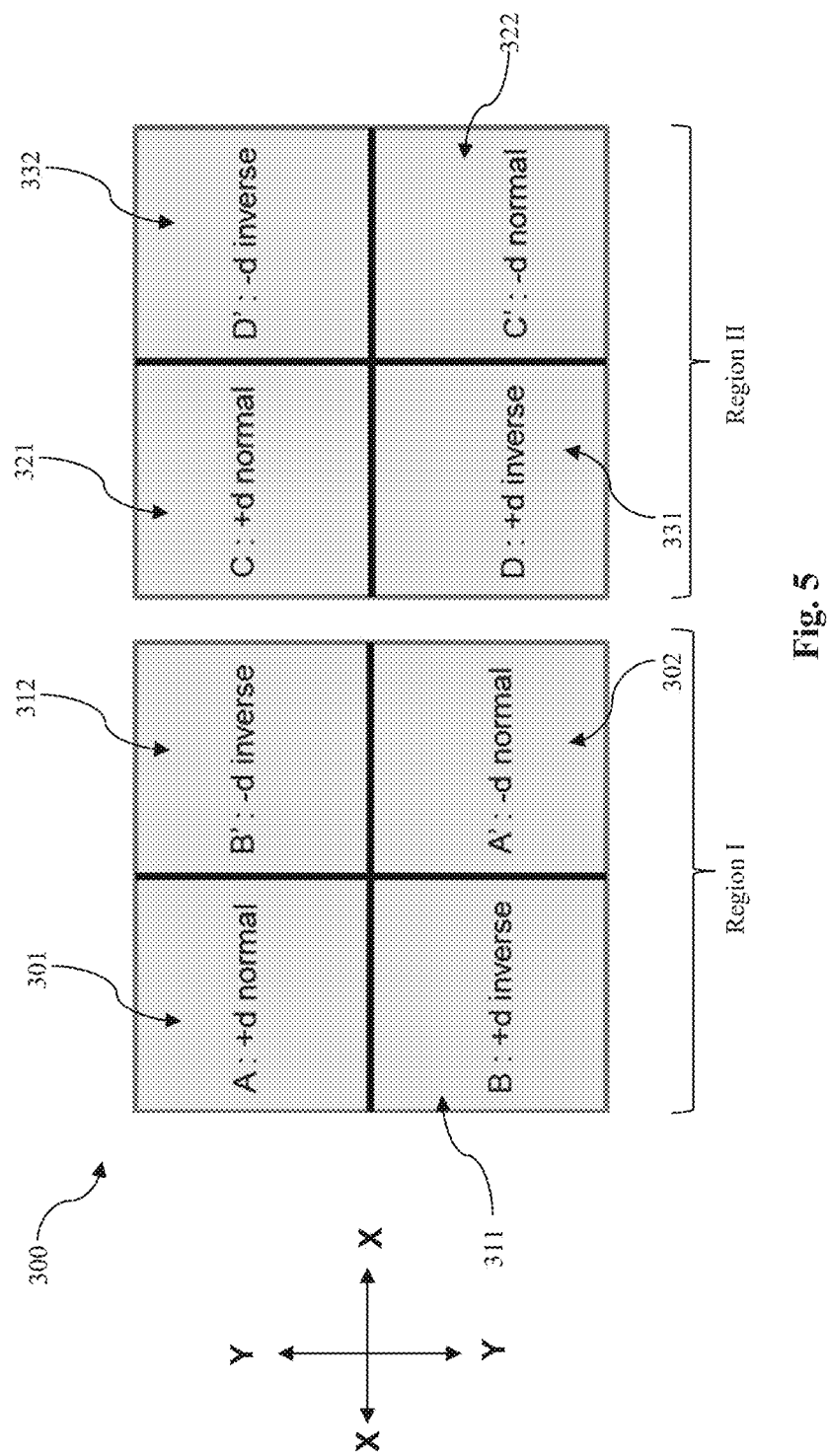
FIG. 5 illustrates a top view of an embodiment of an overlay mark on a substrate in accordance with some embodiments of the present disclosure.

Referring now to FIG. 5, shown therein is a combination overlay mark 300. The overlay mark 300 includes a region I and a region II. In some embodiments, region I and region II are adjacent to (e.g., contiguous to each another) or near one another. In some embodiments, region I and region II are spaced apart. In some embodiments represented by FIG. 5, region I of the overlay mark 300 includes an area A with a +d normal overlay mark 301, an area A' with a -d normal overlay mark 302, an area B with a +d inverse overlay mark 311, and an area B' with a -d inverse overlay mark 312. Region II of the overlay mark 300 includes an area C with a +d normal overlay mark 321, an area C's with a -d normal overlay mark 322, an area D with a +d inverse overlay mark 331, and an area D' with a -d inverse overlay mark 332. In some embodiments, the elongated elements and gratings in areas A, A', B, and B' extend along the X direction, and the elongated elements and gratings in areas C, C', D, and D' extend along the Y direction. In alternative embodiments, the elongated elements and gratings in areas A, A', B, and B' extend along the Y direction, and the elongated elements and gratings in areas C, C', D, and D' extend along the X direction.

Figure 6:
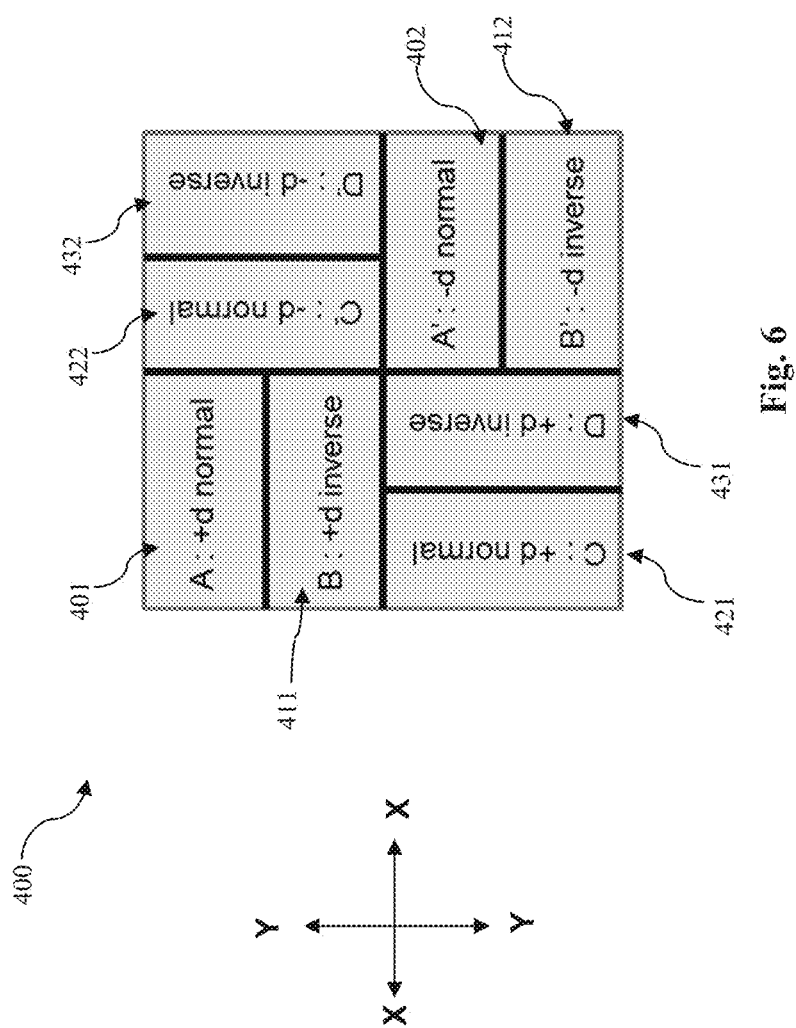
FIG. 6 illustrates a top view of another embodiment of an overlay mark on a substrate in accordance with some embodiments of the present disclosure.

FIG. 6 is another embodiment of a combination overlay mark 400. The overlay mark 400 includes an area A with a +d normal overlay mark 401, an area A' with a -d normal overlay mark 402, an area B with a +d inverse overlay mark 411, an area B' with a -d inverse overlay mark 412, an area C with a +d normal overlay mark 421, an area C' with a −d normal overlay mark 422, an area D with a +d inverse overlay mark 431, and an area D' with a −d inverse overlay mark 432. In some embodiments represented by FIG. 6, the elongated elements and gratings in areas A, A', B, and B' extend along the X direction, and the elongated elements and gratings in areas C, C', D, and D' extend along the Y direction. In alternative embodiments, the elongated elements and gratings in areas A, A', B, and B' extend along the Y direction, and the elongated elements and gratings in areas C, C', D, and D' extend along the X direction.

It is noted that the mirror image compound gratings pairs do not have to be aligned with and adjacent to one another. In the embodiments represented by FIGS. 4A and 4B, the plurality of compound gratings 130 in region 1 is the mirror image of the plurality of compound gratings 132 in region 2. Region 1 of the overlay 202 is aligned with and adjacent to region 2. In the embodiments represented by FIGS. 5 and 6, area A is a mirror image of area B', area B is a mirror image of area A', area C is a mirror image of area D', area D is a mirror image of area C'.

The overlay marks disclosed herein, including the upper layers and lower layers of overlay marks 100, 202, 204, 300 and 400, can be fabricated in any areas of an IC devices. In some embodiments, these overlay marks can be fabricated in scribe lines or scribe areas, which are subject to cutting in singulation processes. In these embodiments, at least a portion of the overlay marks in a singulated die is damaged, leaving behind some remnant overlay marks. In some alternative embodiments, these overlay marks can be fabricated in device areas (i.e. outside of the scribe lines or scribe areas), which are not subject to cutting in singulation processes. In these alternative embodiments, these overlay marks can survive the singulation process and remain intact in a final IC device. Both the intact overlay marks and remnant overlay marks according to the present disclosure can demonstrate a portion of overlay marks being a mirror image or another portion of the overlay marks.

Figure 7:
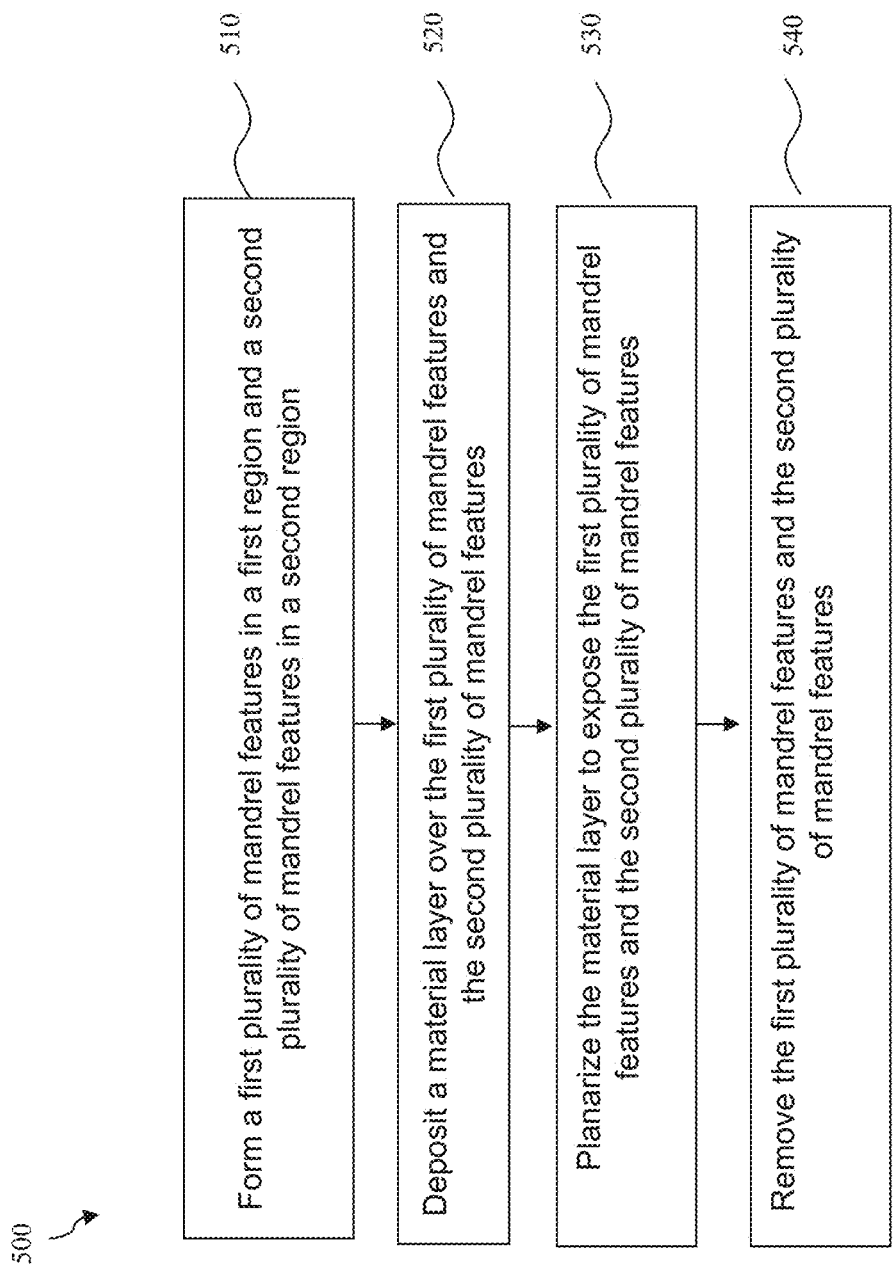
FIG. 7 is a flowchart illustrating the process flow associated with the overlay marks in accordance with some embodiments of the present disclosure

Referring now to FIG. 7, illustrated therein is a flowchart of a method 500 of fabricating an overlay mark on a substrate. The method 500 is merely an example, and is not intended to limit the present disclosure beyond what is explicitly recited in the claims. Additional operations can be provided before, during, and after the method 500, and some operations described can be replaced, eliminated, or moved around for additional embodiments of the method. Exemplary operations of the method 500 will be described below with reference to FIGS. 8 and 9A-9D.

Figure 8:
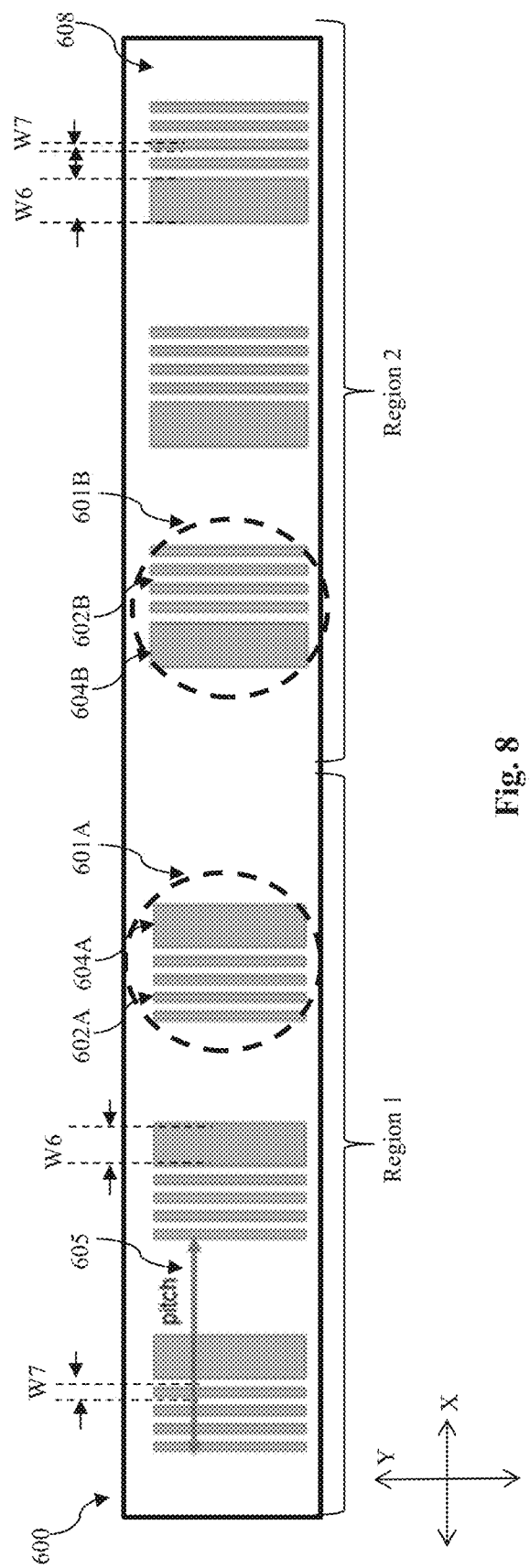
FIG. 8 illustrates a fragmentary top view of mandrels for forming a bottom layer of an overlay mark on a substrate in accordance with some embodiments of the present disclosure.

Referring now to FIGS. 7-8, at operation 510 of the method 500, a plurality of mandrel features 601A of an overlay mark 600 is formed in region 1, and a plurality of mandrel features 601B of the overlay mark 600 is formed in region 2 on a substrate 608. The mandrel features can be fabricated with conventional mandrel forming processes. Note that region 1 has multiple sets or groups of the plurality of mandrel features 601A, and region 2 has multiple sets or groups of the plurality of mandrel features 601B. The pluralities of mandrel features 601A and 601B extend along the Y direction shown in FIG. 8. In one embodiment, each of the plurality of mandrel features 601A includes one elongated element 604A and a plurality of elongated elements 602A. The plurality of mandrel features 601A is disposed at a pitch 605. For example, the pitch 605 (or a distance measured in the X-direction) separates one group of the mandrel features 601A from its nearest group of mandrel features 601A, as shown in FIG. 8. The elongated element 604A includes a width W6 along the X direction, and each of the plurality of elongated elements 602A is equally spaced and includes a width W7. In some embodiments represented by FIG. 8, the width W6 is greater than the width W7. In some embodiments, the width W6 is at least twice as the width W7 to ensure meaningful loading effect brought about by the larger width W6. In some implementations, the plurality of elongated elements 602A includes 2 to 15 elongated elements with the width W7. The plurality of mandrel features 601B in region 2 is a mirror image of the plurality of mandrel features 601A in region 1 with respect to the borderline 610 between regions 1 and 2. Consequently, the plurality of mandrel features 601B is also disposed at the same pitch 605. Each of the plurality of mandrel features 601B includes one elongated element 604B and a plurality of elongated elements 602B. In the embodiments where the elongated element 604A in region 1 has the width W6 and each of the plurality of elongated elements 602A in region 1 has the width W7, the elongated element 604B includes the width W6, and each of the plurality of elongated elements 602B is equally spaced and includes the width W7. FIG. 9A illustrates the Y-direction cross-sectional view of the mandrel features in FIG. 8. The greater width (at least twice of W7) of W6 can give rise to loading effects and result in intentionally introduced unevenness and imperfection in the overlay mark. Because the plurality of mandrel features 601B in region 2 is a mirror image of the plurality of mandrel features 601A in region 1, the unevenness and imperfection in regions 1 and 2 can cancel out and improve the overlay accuracy.

At operations 520, 530 and 540 of the method 500, spacers are formed over sidewalls of the plurality of mandrel features 601A and the plurality of mandrel features 601B. Referring now to FIG. 9B, at operation 520 of the method 500, a spacer layer 700 is deposited over the plurality of mandrel features 601A and the plurality of mandrel features 601B, including over the space between elongated elements.

Figure 9C:
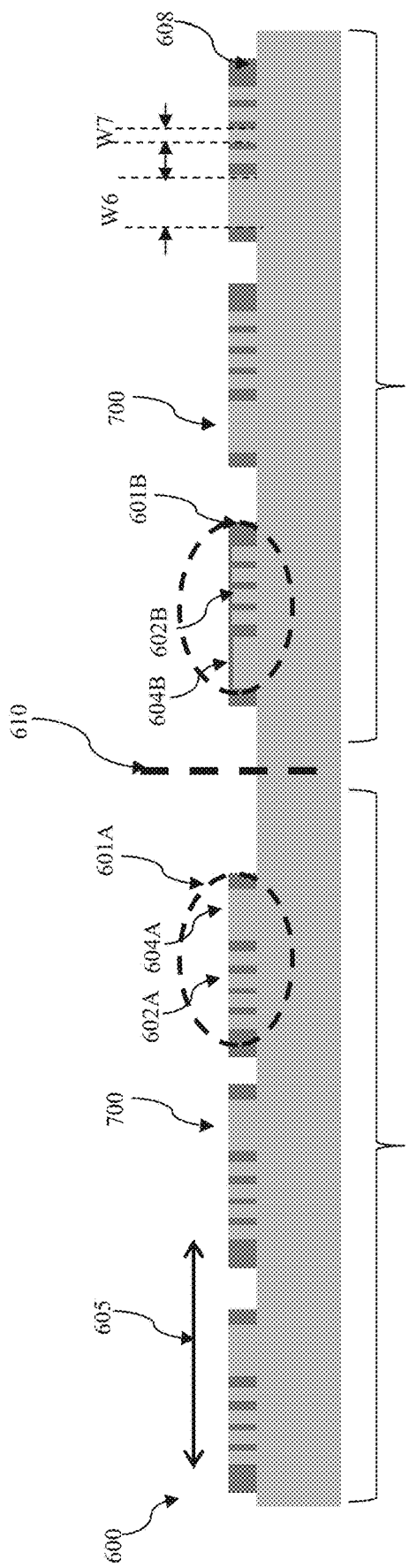
FIG. 9C illustrates a fragmentary cross-sectional view of planarized spacers and mandrel features on a substrate, according to embodiments of the present disclosure.

Reference is now made to FIG. 9C. At operation 530, the deposited spacer layer 700 is planarized to expose the plurality of mandrel features 601A and the plurality of mandrel features 601B.

Figure 9D:
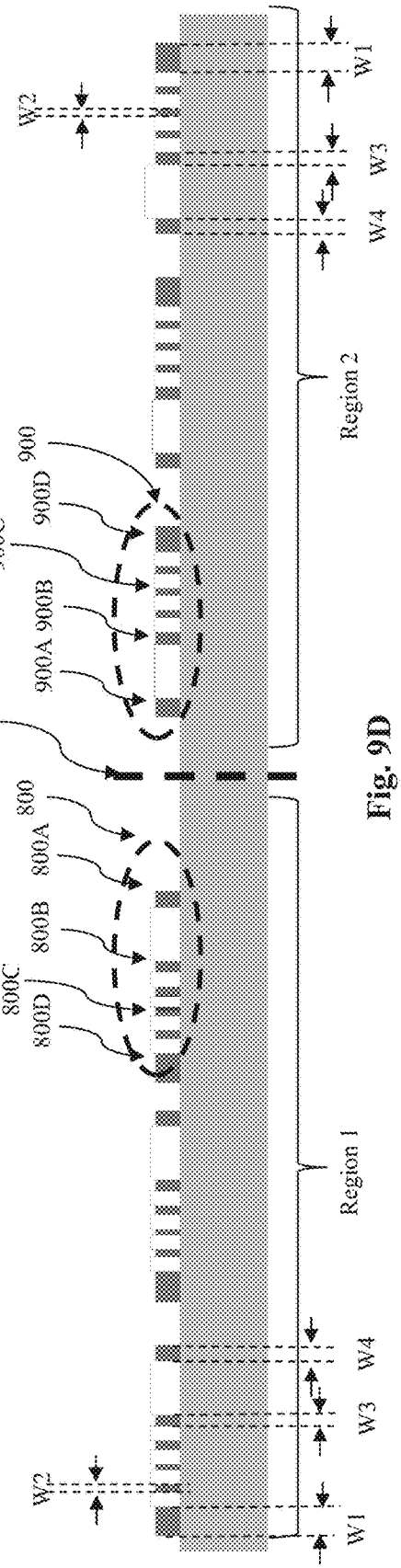
FIG. 9D illustrates a fragmentary cross-sectional view of spacers on a substrate, according to embodiments of the present disclosure.

Referring to FIG. 9D, at operation 540, the plurality of mandrel features 601A and the plurality of mandrel features 601B are removed, leaving behind a plurality of spacers 800 in region 1 and a plurality of spacers 900 in region 2. The plurality of spacers 800 may be referred to as a plurality of compound gratings 800 (e.g., as an embodiment of the compound gratings 130 or 150 discussed above with reference to FIGS. 4A-4B). The plurality of spacers 900 may be referred to as a plurality of compound gratings 900 (e.g., as an embodiment of the compound gratings 132 or 152 discussed above with reference to FIGS. 4A-4B). In some implementations, each of the plurality of compound grating 800 includes one elongated element 800A, one elongated element 800B, a plurality of elongated elements 800C, and one elongated element 800D. In some embodiments, each of the plurality of compound gratings 900 includes one elongated element 900A, one elongated element 900B, a plurality of elongated elements 900C, and one elongated element 900D. In the implementations represented by FIG. 9D, as the plurality of mandrel features 601B is a mirror image of the plurality of mandrel features 601A with respect to the borderline 610, the plurality of compound gratings 900 is a mirror image of the plurality of compound gratings 800 with respect to the borderline 610 as well. In some implementations, each of the elongated elements 800A and 900A has the width W4, each of the elongated elements 800B and 900B has the width W3, each of the elongated elements 800C and 900C has the width W2, and each of the elongated elements 800D and 900D has the width W1. In the implementations represented by FIG. 4A, the width W2 is smaller than each of the width W1, the width W3 and the width W4. The width W1, the width W3 and the Width W4 can be different from one another due to intentional loading effect differential introduced by different widths of the mandrels used to form the elongated elements. In one non-limiting example, the width W4 is greater than the width W3.

FIG. 10 is a flowchart illustrating a method 1000 of semiconductor fabrication according to aspects of the present disclosure. The method 1000 includes a step 1002 of patterning an overlay mark on a substrate. The overlay mark includes an upper layer; and a lower layer disposed below the upper layer. The lower layer can include a first plurality of compound gratings and a second plurality of compound gratings. The first plurality of compound gratings extends in a first direction and is disposed in a first region of the overlay mark. Each of the first plurality of compound gratings can include one first element and at least two second elements disposed on one side of the first element. The second plurality of compound gratings extends in the first direction and is disposed in a second region of the overlay mark. Each of the second plurality of compound gratings can include one third element and at least two fourth elements disposed on one side of the third element. Each of the first element and the third element has a first width along a second direction perpendicular to the first direction. Each of the second elements and the fourth elements has a second width along the second direction. The second width is smaller than the first width. The first plurality of compound gratings is a mirror image of the second plurality of compound gratings. The method 1000 further includes a step 1004 of performing one or more semiconductor manufacturing processes using the overlay mark.

In some embodiments, each of the first plurality of compound gratings may further include one fifth element and the at least two second elements are disposed between the first element and the fifth element. In some embodiments, each the first plurality of compound gratings may further include one sixth element disposed between the at least two fourth elements and the fifth element. In some implementations, each of the first plurality of compound gratings may further include one gap disposed between the sixth element and the fifth element. In some implementations, the fifth element has a third width and the sixth element has a fourth width. Each of the third width and the fourth width is greater than the second width. In some embodiments, the at least two second elements comprise 4 to 12 second elements. In some embodiments, the upper layer may include a third plurality of gratings and the third plurality of gratings may be shifted with respect to the at least two second elements in the second direction. In some instances, the upper layer may further include a fourth plurality of gratings and the fourth plurality of gratings is shifted with respect to the at least two fourth elements in the second direction. In some embodiments, the first region of the overlay mark is adjacent to and aligned with the second region of the overlay mark along the second direction.

It is understood that additional processes may be performed before, during, or after the steps 1002-1004 of the method 1000. For reasons of simplicity, additional steps are not discussed herein in detail.

Figure 11:
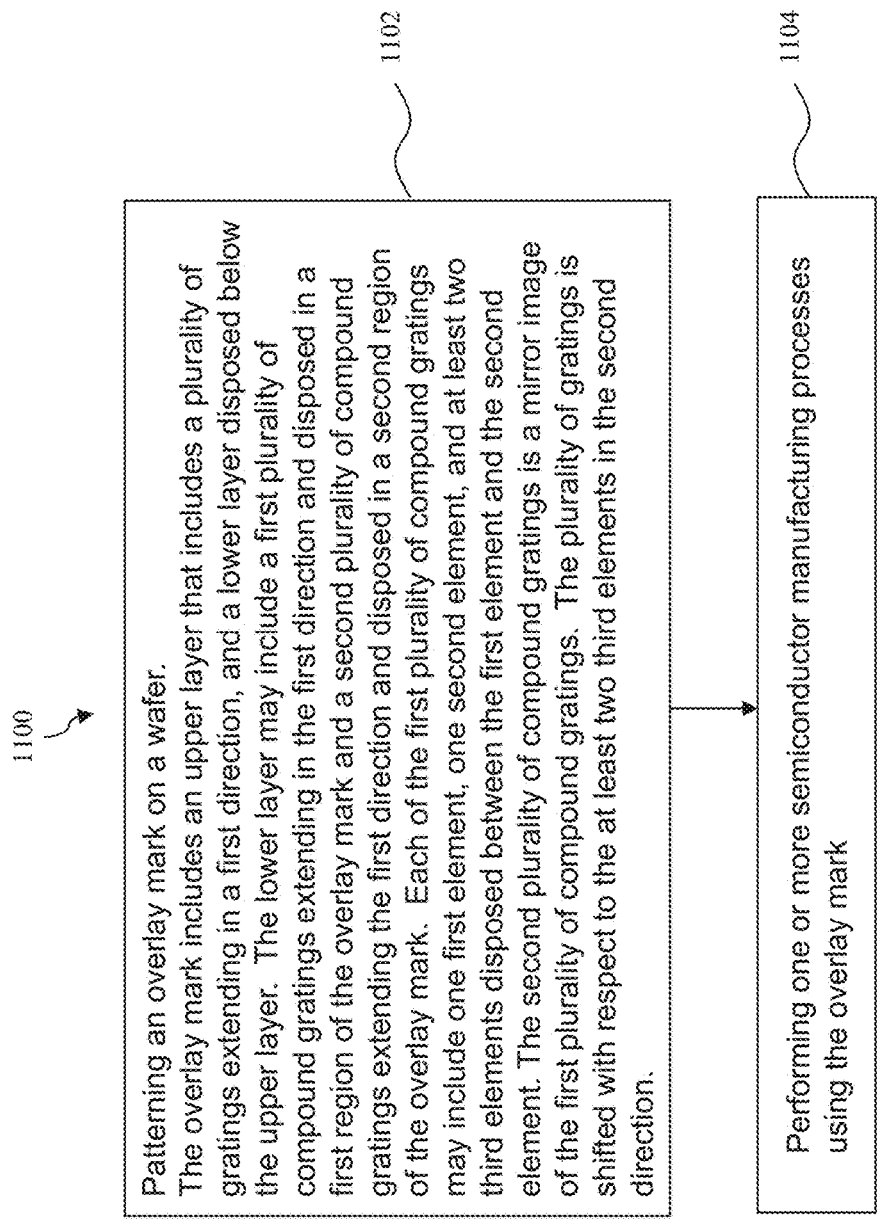

FIG. 11 is a flowchart illustrating a method 1100 of semiconductor fabrication according to aspects of the present disclosure. The method 1100 includes a step 1102 of patterning an overlay mark on a substrate. The overlay mark includes an upper layer that includes a plurality of gratings extending in a first direction, and a lower layer disposed below the upper layer. The lower layer may include a first plurality of compound gratings extending in the first direction and disposed in a first region of the overlay mark and a second plurality of compound gratings extending the first direction and disposed in a second region of the overlay mark. Each of the first plurality of compound gratings may include one first element, one second element, and at least two third elements disposed between the first element and the second element. The first element has a first width along a second direction perpendicular to the first direction and each of the at least two third elements has a second width along the second direction. The second width is smaller than the first width. The second plurality of compound gratings is a mirror image of the first plurality of compound gratings. The plurality of gratings is shifted with respect to the at least two third elements in the second direction. The method 1100 further includes a step 1104 of performing one or more semiconductor manufacturing processes using the overlay mark.

In some embodiments, a portion of the second plurality of compound gratings may be shifted with respect to the plurality of gratings in the second direction. In some embodiments, each of the first plurality of compound gratings may further include one fourth element between the second element and the at least two third elements. In some implementations, each of the first plurality of compound gratings may further include one gap disposed between the second element and the fourth element. In some implementations, the fourth element has a fourth width and the fourth width is greater than the second width. In some instances, the at least two third elements may include 4 to 12 second elements. In some instances, the first region of the overlay mark is adjacent to and aligned with the second region of the overlay mark along the second direction.

It is understood that additional processes may be performed before, during, or after the steps 1102-1104 of the method 1100. For reasons of simplicity, additional steps are not discussed herein in detail.

One embodiment of the present disclosure pertains to an integrated circuit (IC) device. The IC device includes an overlay mark on a substrate. The overlay mark includes an upper layer and a lower layer disposed below the upper layer. The lower layer includes a first plurality of compound gratings extending in a first direction and disposed in a first region of the overlay mark, each of the first plurality of compound gratings including one first element and at least two second elements disposed on one side of the first element, and a second plurality of compound gratings extending in the first direction and disposed in a second region of the overlay mark, each of the second plurality of compound gratings including one third element and at least two fourth elements disposed on one side of the third element. The first element and the third element each have a first width along a second direction perpendicular to the first direction. Each of the second elements and each of the fourth elements has a second width along the second direction, the second width being smaller than the first width. The first plurality of compound gratings is a mirror image of the second plurality of compound gratings.

In some embodiments, each of the first plurality of compound gratings of lower layer the further includes one fifth element. The at least two second elements are disposed between the first element and the fifth element. In some implementations, each the first plurality of compound gratings further includes one sixth element disposed between the at least two fourth elements and the fifth element. In some instances, each of the first plurality of compound gratings further includes one gap disposed between the sixth element and the fifth element. In some embodiments, the fifth element has a third width and the sixth element has a fourth width. Each of the third width and the fourth width is greater than the second width. In some implementations, the lower layer further includes a third plurality of compound gratings extending in the second direction and a fourth plurality of compound gratings extending in the second direction. The third plurality of compound gratings is a mirror image of the fourth plurality of compound gratings. In some embodiments, the upper layer includes a third plurality of gratings and the third plurality of gratings is shifted with respect to the at least two second elements in the second direction. In those embodiments, the upper layer further includes a fourth plurality of gratings and the fourth plurality of gratings is shifted with respect to the at least two fourth elements in the second direction. In some instances, the first region is adjacent to and aligned with the second region along the second direction.

Another embodiment of the present disclosure pertains to a method of fabricating a semiconductor device. The method includes patterning an overlay mark on a substrate and performing one or more semiconductor fabrication process using the overlay mark. The overlay mark includes an upper layer comprising a plurality of gratings extending in a first direction, and a lower layer disposed below the upper layer. The lower layer includes a first plurality of compound gratings extending in the first direction and disposed in a first region of the overlay mark, each of the first plurality of compound gratings including one first element, one second element, and at least two third elements disposed between the first element and the second element; and a second plurality of compound gratings extending the first direction and disposed in a second region of the overlay mark. The first element has a first width along a second direction perpendicular to the first direction and each of the at least two third elements has a second width along the second direction, the second width smaller than the first width. The second plurality of compound gratings is a mirror image of the first plurality of compound gratings. The plurality of gratings is shifted with respect to the at least two third elements in the second direction.

In some embodiments, a portion of the second plurality of compound gratings is shifted with respect to the plurality of gratings in the second direction. In those embodiments, each of the first plurality of compound gratings further includes one fourth element and the fourth element is between the second element and the at least two third elements. Also, in these embodiments, each of the first plurality of compound gratings further includes one gap disposed between the second element and the fourth element. Additionally, the fourth element has a fourth width, and the fourth width is greater than the second width. In some implementations, the lower layer further includes a third plurality of compound gratings extending in the second direction and a fourth plurality of compound gratings extending in the second direction. The third plurality of compound gratings is a mirror image of the fourth plurality of compound gratings. In some instances, the first region is spaced apart from the second region.

Another embodiment of the present disclosure pertains to a method of fabricating an overlay mark on a substrate. The method includes forming a first plurality of mandrel features at a pitch in a first region of the substrate, forming a second plurality of mandrel features at the pitch in a second region of the substrate such that the second plurality of mandrel features comprises a mirror image of the first plurality of mandrel features, forming spacers over sidewalls of the first plurality of mandrel features and the second plurality of mandrel features, and removing the first plurality of mandrel features and the second plurality of mandrel features. In this embodiment, the first plurality of mandrel features extends in a first direction. Each of the first plurality of mandrel features includes one first mandrel and at least two second mandrels disposed on a side of the first mandrel. The first mandrel has a first width along a second direction perpendicular to the first direction and each of the second mandrels has a second width along the second direction. The first width greater than the second width.

In some embodiments, the first region is spaced apart from the second region. In some implementations, the first width is at least twice of the second width. In some instances, forming of the spacers over sidewalls of the first plurality of mandrel features and the second plurality of mandrel features includes depositing spacer material over the first plurality of mandrel features and the second plurality of mandrel features, and planarizing the spacer material to expose top surfaces of the first plurality of mandrel features and the second plurality of mandrel features.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) device, comprising:
   an overlay mark on a substrate, wherein the overlay mark comprises:
   an upper layer; and
   a lower layer disposed below the upper layer, the lower layer comprising:
   a first plurality of compound gratings extending in a first direction and disposed in a first region of the overlay mark, each of the first plurality of compound gratings including one first element and at least two second elements disposed on one side of the first element, and
   a second plurality of compound gratings extending in the first direction and disposed in a second region of the overlay mark, each of the second plurality of compound gratings including one third element and at least two fourth elements disposed on one side of the third element,
   wherein the first element and the third element each have a first width along a second direction perpendicular to the first direction, wherein each of the second elements and each of the fourth elements has a second width along the second direction, the second width being smaller than the first width,
   wherein the first plurality of compound gratings is a mirror image of the second plurality of compound gratings.

2. The IC device of claim 1, wherein each of the first plurality of compound gratings further includes one fifth element, the at least two second elements being disposed between the first element and the fifth element.

3. The IC device of claim 2, wherein each the first plurality of compound gratings further includes one sixth element disposed between the at least two fourth elements and the fifth element.

4. The IC device of claim 3, wherein each of the first plurality of compound gratings further includes one gap disposed between the sixth element and the fifth element.

5. The IC device of claim 4,
wherein the fifth element has a third width and the sixth element has a fourth width, and
wherein each of the third width and the fourth width is greater than the second width.

6. The IC device of claim 1, wherein the lower layer further comprising a third plurality of compound gratings extending in the second direction and a fourth plurality of compound gratings extending in the second direction, wherein the third plurality of compound gratings is a mirror image of the fourth plurality of compound gratings.

7. The IC device of claim 1, wherein the upper layer comprises a third plurality of gratings, the third plurality of gratings being shifted with respect to the at least two second elements in the second direction.

8. The IC device of claim 7, wherein the upper layer further comprises a fourth plurality of gratings, the fourth plurality of gratings being shifted with respect to the at least two fourth elements in the second direction.

9. The IC device of claim 1, wherein the first region is adjacent to and aligned with the second region along the second direction.

10. A semiconductor device, comprising:
an overlay mark comprising:
a lower layer comprising first compound gratings and second compound gratings, and
an upper layer comprising third compound gratings and fourth compound gratings,
wherein the third compound gratings are disposed over the first compound gratings and the fourth compound gratings are disposed over the second compound gratings,
wherein the first compound gratings are a mirror image of the second compound gratings,
wherein the first compound gratings comprise a first wide mandrel and a first plurality of narrow mandrels, a width of the first wide mandrel being greater than a width of each of the first plurality of narrow mandrels,
wherein the second compound gratings comprise a second wide mandrel and a second plurality of narrow mandrels, a width of the second wide mandrel being greater than a width of each of the second plurality of narrow mandrels.

11. The semiconductor device of claim 10,
wherein a pitch of the first plurality of narrow mandrels is identical to a pitch of the third compound gratings,
wherein a pitch of the second plurality of narrow mandrels is identical to a pitch of the fourth compound gratings.

12. The semiconductor device of claim 11,
wherein the third compound gratings are shifted from the first plurality of narrow mandrels along a first direction by a distance,
wherein the fourth compound gratings are shifted from the second plurality of narrow mandrels along a second direction by the distance,
wherein the first direction is opposite to the second direction.

13. The semiconductor device of claim 10,
wherein the first compound gratings further comprise a first gap,
wherein the second compound gratings further comprise a second gap.

14. The semiconductor device of claim 13,
wherein the first gap is spaced apart from the first wide mandrel by the first plurality of narrow mandrels,
wherein the second gap is spaced apart from the second wide mandrel by the second plurality of narrow mandrels.

15. The semiconductor device of claim 10, wherein the first compound gratings are adjacent to the second compound gratings.

16. An overlay mark, comprising:
first compound gratings and second compound gratings in a lower layer; and
third compound gratings and fourth compound gratings in an upper layer disposed over the lower layer,
wherein the third compound gratings are disposed over the first compound gratings and the fourth compound gratings are disposed over the second compound gratings,
wherein the first compound gratings comprise a first wide mandrel, a first gap, and a first plurality of narrow mandrels,
wherein a width of the first wide mandrel is greater than a width of each of the first plurality of narrow mandrels,
wherein the second compound gratings comprise a second wide mandrel, a second gap, and a second plurality of narrow mandrels,
wherein a width of the second wide mandrel is greater than a width of each of the second plurality of narrow mandrels.

17. The overlay mark of claim 16, wherein the first compound gratings are a mirror image of the second compound gratings.

18. The overlay mark of claim 16,
wherein a pitch of the first plurality of narrow mandrels is identical to a pitch of the third compound gratings,
wherein a pitch of the second plurality of narrow mandrels is identical to a pitch of the fourth compound gratings.

19. The overlay mark of claim 16,
wherein the third compound gratings are shifted from the first plurality of narrow mandrels along a first direction by a distance,
wherein the fourth compound gratings are shifted from the second plurality of narrow mandrels along a second direction by the distance,
wherein the first direction is opposite to the second direction.

20. The overlay mark of claim 16,
wherein the first gap is spaced apart from the first wide mandrel by the first plurality of narrow mandrels,
wherein the second gap is spaced apart from the second wide mandrel by the second plurality of narrow mandrels.

* * * * *